United States Patent [19]

Brassington et al.

[11] Patent Number: 5,350,705
[45] Date of Patent: Sep. 27, 1994

[54] FERROELECTRIC MEMORY CELL ARRANGEMENT HAVING A SPLIT CAPACITOR PLATE STRUCTURE

[75] Inventors: Michael P. Brassington; Andreas G. Papaliolios, both of Sunnyvale, Calif.

[73] Assignee: National Semiconductor Corporation, Santa Clara, Calif.

[21] Appl. No.: 934,949

[22] Filed: Aug. 25, 1992

[51] Int. Cl.$^5$ ............... H01L 29/78; H01L 21/70; H01L 27/00
[52] U.S. Cl. ................... 257/295; 257/306; 437/52; 437/60; 437/192; 437/919
[58] Field of Search ............ 437/52, 60, 47, 919; 257/295, 306; 365/165

[56] References Cited

U.S. PATENT DOCUMENTS

| | | | |
|---|---|---|---|
| 4,649,406 | 3/1987 | Takemae et al. | 357/23.6 |
| 4,759,823 | 7/1988 | Asselanis et al. | 156/659.1 |
| 4,782,380 | 11/1988 | Shankar et al. | 357/71 |
| 4,860,254 | 8/1989 | Pott et al. | 365/145 |
| 4,873,664 | 10/1989 | Eaton, Jr. | 365/145 |
| 4,914,627 | 4/1990 | Eaton, Jr. | 365/145 |
| 4,982,309 | 1/1991 | Shepherd | 361/321 |
| 5,046,043 | 9/1991 | Miller et al. | 365/145 |
| 5,060,191 | 10/1991 | Nagasaki et al. | 365/145 |
| 5,081,559 | 1/1992 | Fazan et al. | 361/313 |
| 5,187,638 | 2/1993 | Sandhu et al. | 361/313 |

FOREIGN PATENT DOCUMENTS 0338157 10/1989 European Pat. Off. .
0469934A2 8/1991 European Pat. Off. .

Primary Examiner—Olik Chaudhuri
Assistant Examiner—H. Jey Tsai
Attorney, Agent, or Firm—Richards, Medlock & Andrews

[57] ABSTRACT

A ferroelectric memory cell architecture in which a pair of cells is fabricated so as to share common elements, and wherein ferroelectric capacitors are fabricated overlying the associated select transistors, thereby achieving a small-area cell architecture. First level refractory metal interconnects formed prior to ferroelectric material deposition steps are utilized with subsequently formed second metallization layers to provide interconnections between the ferroelectric capacitor plates and the underlying transistor regions.

44 Claims, 9 Drawing Sheets

FERROELECTRIC MEMORY CELL ARRANGEMENT HAVING A SPLIT CAPACITOR PLATE STRUCTURE

TECHNICAL FIELD OF THE INVENTION

The present invention relates in general to ferroelectric memories, and more particularly to ferroelectric memories of the type employing MOS fabrication technology.

BACKGROUND OF THE INVENTION

The trend in the semiconductor industry is to increase the density of circuits formed on a semiconductor die of a given size, thereby increasing the circuit functions that can be performed on such die. Semiconductor circuits can be made smaller by the use of new photolithography equipment and techniques so that the line widths and features of circuit elements can be made smaller. However, such equipment is extremely expensive and can present a substantial capital expenditure. On the other hand, the circuit architecture can often be changed so that the same circuits can be fabricated in a smaller area of the semiconductor material. New circuit architecture techniques by which smaller-area circuits can be realized include trench methods for forming capacitors, and stacking components on top of each other on the semiconductor substrate. Ferroelectric capacitors utilized in semiconductor memories can be easily made smaller and yet accomplish the same capacitance as DRAM type MOS capacitors, in that the ferroelectric material has a substantially higher dielectric constant than other more conventional dielectrics such as silicon dioxide or tantalum pentoxide.

The miniaturization or scaling of ferroelectric circuits involves certain considerations and concerns that do not arise with other types of circuits. For example, special precautions and materials are required in the fabrication of ferroelectric circuits because of the high temperatures involved. The sintering step, in which the ferroelectric material is heated to temperatures upwardly of 600°–800° C. to form the polarizable ceramic material, is sufficiently high to adversely affect various other materials typically used in semiconductor memories. Because of the high temperatures involved during the sintering step, materials such as aluminum which melt or flow at such temperature, often must be deposited after the sintering step. Because of the necessity for providing circuit interconnects after the sintering step, various process inefficiencies arise. One inefficiency that arises is that the semiconductor area required generally increases to accommodate the post-sintering deposition of the metal interconnects. Another concern attendant with the fabrication of ferroelectric components is the adverse effect thereon of processes and materials that generate hydrogen. It is well known that when a reaction between hydrogen and ferroelectric material occurs, the result is the degradation of the ferroelectric material, sometimes to the extent that the ferroelectric material is not usable.

It is well known that refractory metals, such as tungsten, are ideally suited for use in forming interconnections and can withstand high temperatures up to over 1,000° C. The tungsten material has been employed successfully with conventional semiconductor processing equipment in forming conductors and interconnections in conventional non-ferroelectric, semiconductor circuits. However, the chemical vapor deposition (CVD) technique for depositing tungsten is a hydrogen intensive process that is extremely degenerative to ferroelectric material. Accordingly, the use of tungsten in ferroelectric circuits has been discouraged as the materials are not complementary with respect to processing and results.

From the foregoing, it can be seen that a need exists for a technique in which tungsten or other refractory metals can be employed in the fabrication of semiconductor circuits, prior to the deposition and sintering of ferroelectric material, and thereby realize circuits of smaller area. Another need exists for a small area ferroelectric cell in which the ferroelectric capacitor is formed overlying an associated transistor, and the employment of processing techniques for utilizing a refractory metal to provide vertical interconnects between the ferroelectric capacitor plate and the underlying transistor. Another need exists for a technique for fabricating high density ferroelectric memory cells utilizing conventional semiconductor processing equipment and materials.

SUMMARY OF THE INVENTION

In accordance with the principles and concepts of the present invention, ferroelectric memory cell architectures and methods of fabrication thereof are achieved, that substantially reduce or eliminate the problems associated with the prior art devices and techniques. In accordance with one aspect of the invention, an MOS transistor pair is fabricated in a conventional manner in the face of a semiconductor wafer. The semiconductor wafer can then be optionally passivated and planarized so that a ferroelectric capacitor pair can be formed overlying the transistor and in contact with the transistor components. Prior to the formation of the ferroelectric capacitor components, the wafer is patterned and etched to form vias in the passivation to the transistor source and/or drain regions. Vias can also be formed to the various transistor regions for connection to bit lines. Thereafter, a refractory metal is deposited on the wafer and patterned to form transistor source and/or drain interconnect regions, as well as bit lines. After the patterning of the refractory metal, the wafer is again passivated and planarized for the subsequent formation thereon of the ferroelectric capacitor components. The passivation provides an insulation between the refractory first level metal and the ferroelectric material that is subsequently deposited on the wafer.

In accordance with another feature of the invention, a highly compact memory arrangement includes two cells that share components. The cell pair is fabricated by forming two MOS transistors having a common source region, and forming thereover reaction barriers of silicon nitride and titanium dioxide to further isolate reactions between ferroelectric material and the silicon material. Formed on the reaction barrier is a bottom capacitor plate electrode that is split to define two capacitor plates for two respective capacitors. A single layer of ferroelectric material is then formed on the split bottom plates, followed by a single top capacitor plate that is common to both capacitors. After various other insulation layers are formed to isolate the plates of the capacitor, a second metal layer is formed on the wafer and patterned to connect the bottom plates of the capacitors to the first layer refractory metal, thereby connecting the capacitors to the respective transistors. During this same process step, the metal is also patterned for connection to the common top plate of the capacitors, thereby forming a drive line.

A ferroelectric memory cell structure formed according to the invention requires much less area than those heretofore utilized. Indeed, it is contemplated that ferroelectric memory cells fabricated according to the invention can be made in arrays in excess of 256K cells per die, whereas prior, well-known ferroelectric cells could be made in arrays of only 16K for the same size die.

According to another embodiment of the invention, a dual memory cell is similarly formed, but in this case, the split bottom capacitor plates are patterned for direct connection to the first level metallization interconnects which provide connections to the transistors. The ferroelectric dielectric and the common top plate is formed as in the first embodiment. In this embodiment, the bottom capacitor plates are not accessible at the surface of the processed wafer, but the dual cell can be fabricated in yet a smaller area.

BRIEF DESCRIPTION OF THE DRAWINGS

Further features and advantages will become more apparent from the following and more particular description of the preferred and other embodiments of the invention, as illustrated in the accompanying drawings in which like reference characters generally refer to the same parts or elements throughout the views, and in which.

DETAILED DESCRIPTION OF THE INVENTION

The principles and concepts of the invention are particularly applicable to semiconductor memories of the type employing a ferroelectric capacitor for providing nonvolatile storage of data. The ferroelectric material has a characteristic hysteresis curve and thus can store one stable data state by being polarized in one direction, or can store an opposite data state by being polarized in the opposite direction. The polarized states remain in the ferroelectric material, irrespective of supply voltage or power applied to the memory. Ferroelectric memory cells can be written and read at high speeds, and because of the nonvolatile characteristic, such type of memories are highly advantageous in view of the prior, well-known dynamic random access type of memories which are volatile and require constant refreshing.

As used herein, the term "ferroelectric" connotes any type of material having remanent polarization properties, and is polarizable by an electric field, as contrast to a magnetic field. Various ferroelectric materials include the family of PZT, PLT and PLZT, and other perovskite materials. While the techniques and equipment for preparing and depositing the ferroelectric material on semiconductor substrates is not substantially different from that in fabricating traditional semiconductor memories, the fabrication of the ferroelectric capacitors is usually carried out in a separate stage of the process, as the ferroelectric material itself must be exposed to high temperatures to change the crystal structure into that which can be polarized. One technique for preparing a ferroelectric material is described in U.S. Pat. No. 4,946,710. Accordingly, the general practice for fabricating ferroelectric memories is to first process a semiconductor wafer to form the transistors and other access circuits of the memory array. Thereafter, the individual ferroelectric capacitors are formed on the wafer by depositing a bottom plate electrode, then the ferroelectric dielectric material, and then the top plate electrode. Various metal deposition and patterning steps are also carried out to connect each capacitor to an associated transistor, thereby forming a non-volatile single-transistor, single-capacitor memory cell. Bit lines, drive lines and word lines are also formed for accessing the various cells of the memory array and providing read-out signals to sensing circuits.

Figure 1:
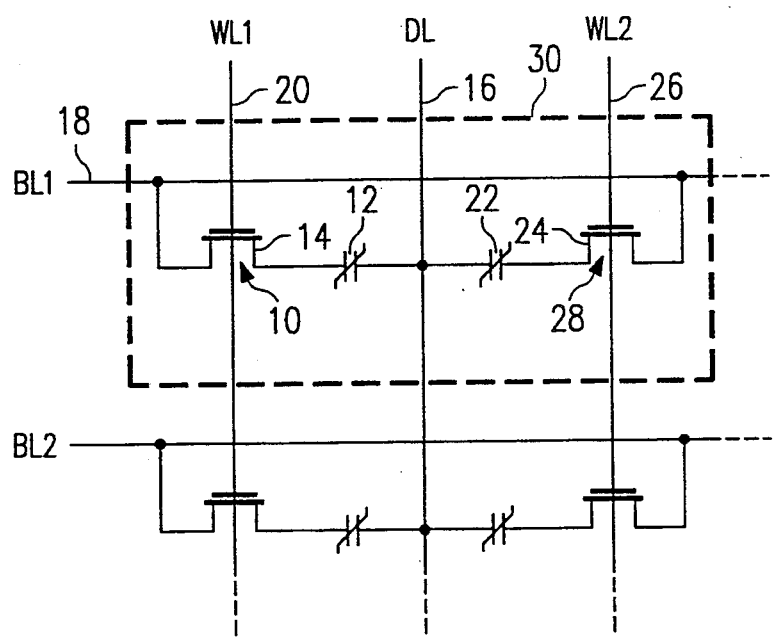
FIG. 1 schematically illustrates an array of memory cells according to the invention.

An exemplary two-by-two array of ferroelectric memory cells is shown in FIG. 1. Each memory cell, such as one shown by reference numeral 10, includes a ferroelectric capacitor 12 connected in series with a select transistor 14, the pair of components being connected between a drive line 16 and a bit line 18. In the embodiment shown in FIG. 1, other memory cells connected in a row are also connected to the bit line 18. Similarly, other memory cells connected in the column are connected to the drive line 16. The select transistor 14 of the memory cell 10 is selected by a signal on the word line 20 which extends parallel to the drive line 16. In the illustrated embodiment, the drive line 16 and the word line 20 are paired together and define a column of the array, whereas a number of bit lines are extended through the array in a perpendicular manner to define rows. While not shown, the bit lines are connected to sense amplifier circuits to resolve the small read out voltages into corresponding digital states.

Those skilled in the art readily understand the operation of ferroelectric memory cells. Notwithstanding, the read and write operations are carried out with the following brief description. In the array shown in FIG. 1, an entire column of cells is simultaneously accessed, whereas other array architectures allow each cell to be accessed individually. In order to write the ferroelectric capacitor 12 of cell 10 with a desired data state, the word line 20 is driven to a high level, thereby driving the select transistor 14 into conduction and connecting the ferroelectric capacitor 12 between the drive line 16 and the bit line 18. Thereafter, the appropriate digital states are applied to the drive line 16 and the bit line 18 so that either a low is placed on the drive line 16 and a high on the bit line 18, or vice versa, such that the ferroelectric capacitor 12 is polarized in one state or the other. As noted above, the polarization state remains in the ferroelectric capacitor 12 irrespective of whether a supply voltage remains applied to the memory chip. Of course, the data state can be changed by writing the ferroelectric capacitor 12 with an opposite polarization state.

In order to read a data state from the ferroelectric capacitor 12, the word line 20 is again driven to a high level, and thereafter the drive line 16 is pulsed, whereupon an electrical charge of magnitude corresponding to one polarization state or the other is transferred to the bit line 18. During read operations, but prior to the application of the drive line pulse, the bit line 18 is precharged and then left floating. A sense amplifier (not shown) connected to the bit line 18 determines whether the read out charge corresponds to one polarization state, or the other, and can thereby provide a corresponding digital output. It should be noted that the ferroelectric capacitor 12 is a destructive readout component, at least as to one polarization state, thereby necessitating a subsequent memory operation to restore the capacitor 12 to its original polarization state.

Figure 2:
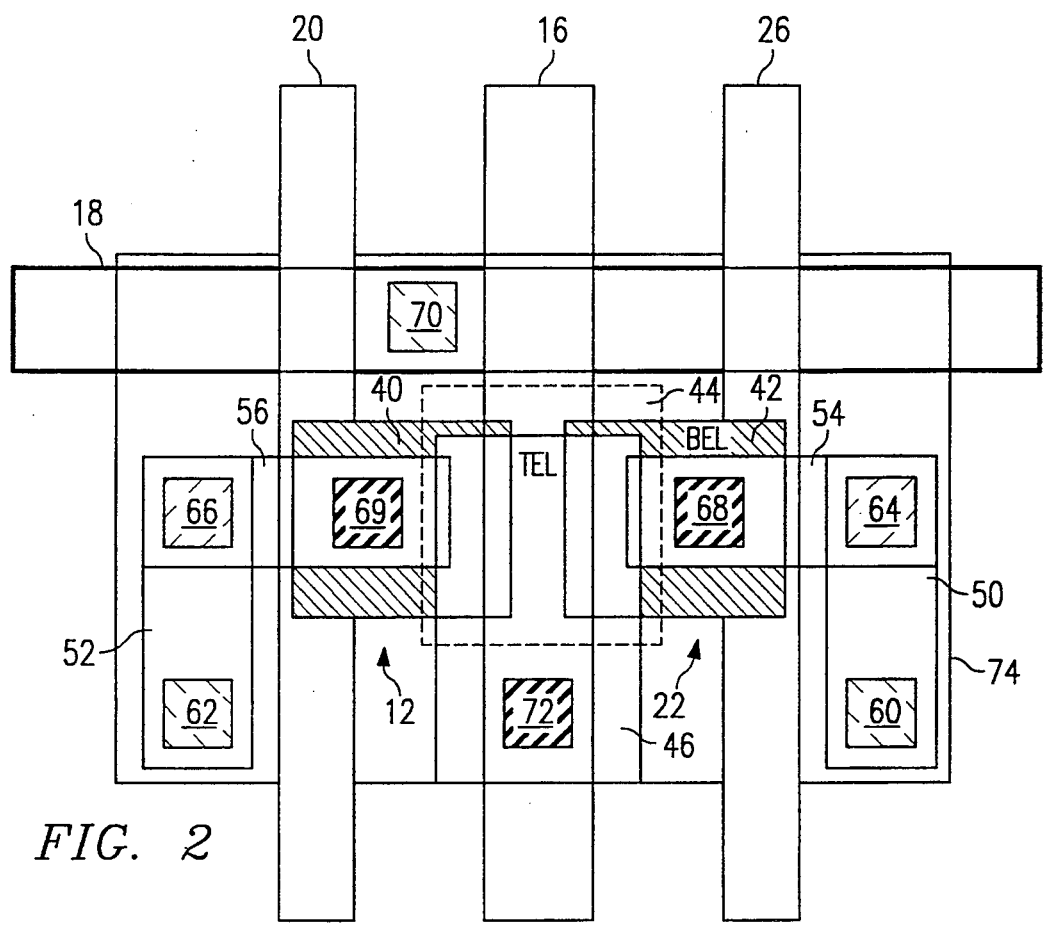
FIG. 2 is a top plan view of the memory cell of FIG. 1.
Figure 3:
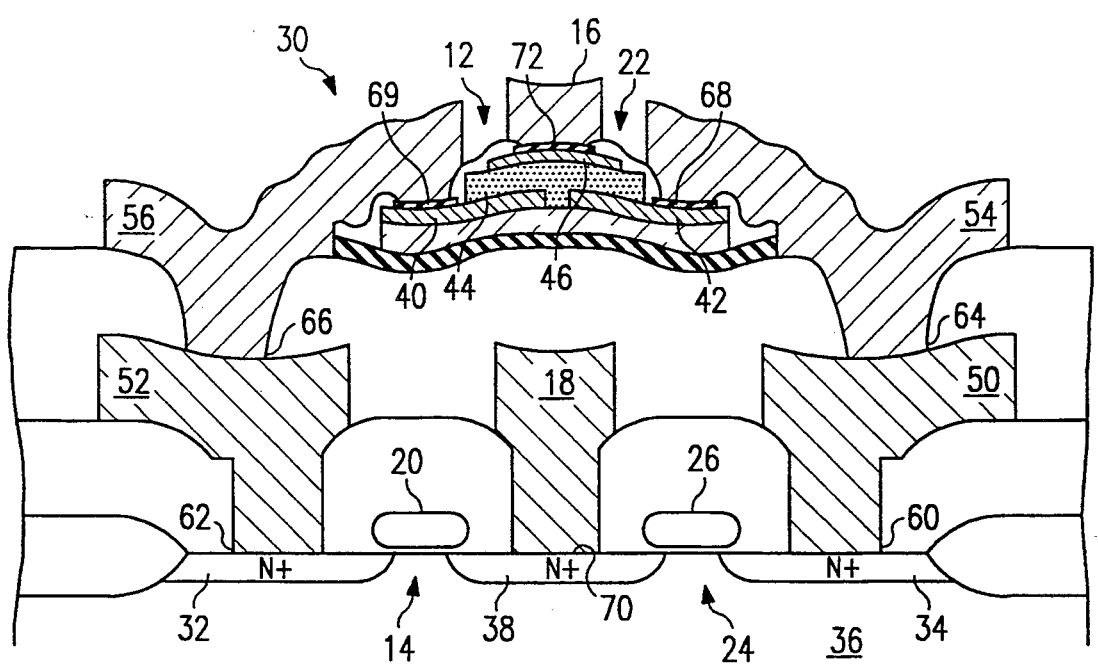
FIG. 3 is a cross-sectional view illustrating the structural features of the memory cell architecture of FIG. 2.

According to the invention, a pair of memory cells 10 and 28 enclosed by the broken line 30 is efficiently fabricated in or on a semiconductor substrate, a top plan view of which is shown in FIG. 2 and a sectional view is shown in FIG. 3. The other cell 28 of the pair 30 comprises a ferroelectric capacitor 22 and a select transistor 24, also connected between the common drive line 16 and the common bit line 18. The select transistor 24 is driven by a different word line 26. The corresponding components and lines of the cell pair 30 are illustrated in FIGS. 2 and 3. By repeating the cell pair 30 on the semiconductor substrate, a highly compact array of ferroelectric memory cells can be achieved.

As noted in FIG. 2, a pair of word lines 20 and 26, each associated with a different cell, extend in a parallel direction together with a drive line 16 therebetween. The bit line 18 extends throughout the array in a direction perpendicular to the word lines and the drive lines. As can be appreciated, both memory cells 10 and 28 share the same drive line 16 and bit line 18, but are driven by respective word lines 20 and 26. As more clearly shown in the cross section of FIG. 3, the transistors 14 and 24, which are both N-channel, have separate N-type drain regions 32 and 34 formed in a semiconductor substrate 36, but share a common N-type source region 38 that is connected to the bit line 18. Moreover, the ferroelectric capacitors 12 and 22 of the memory cell pair 30 are efficiently fabricated by forming split bottom plates 40 and 42, a single and continuous layer of ferroelectric material 44, and a single, common top plate 46 that is connected to the drive line 16. Further, the ferroelectric capacitors 12 and 22 are formed in a location overlying the respective transistors 14 and 24, thereby conserving lateral semiconductor area. While the transistors 14 and 24 are illustrated as being MOS N-channel transistors, it is understood that P-channel MOS transistors can be utilized, as well as transistors of other types, or combinations of transistors such as CMOS, BICMOS, etc.

In accordance with an important feature of the invention, the vertical topology of the cell pair 30 is achieved by first level metal interconnects 50 and 52, together with second level metal interconnects 54 and 56 to thereby connect the transistors 14 and 24 to the respective capacitors 12 and 22. The metal bit line 18 is formed of the same material and at the same time as the first level metal interconnects 50 and 52. The first level metal interconnects 50 and 52 are formed prior to the ferroelectric capacitors 12 and 22, whereas the second level metal interconnects 54 and 56 are formed subsequent to the formation of the ferroelectric capacitors. Thus, the first level metal interconnects 50 and 52 must be able to withstand the processing temperatures of the ferroelectric material, while the second level metal interconnects 54 and 56 can be any suitable type of conductor material.

Referring again to FIGS. 2 and 3, other material layers and regions are identified to facilitate the understanding of the process steps that are described in more detail below. The contacts 60 and 62 to the respective first metal interconnects 50 and 52 are connected to the underlying drain regions 34 and 32 of the select transistors 14 and 24. Interface contact areas 64 and 66 provide the connections between the first level metal interconnects 50 and 52 and the respective second level metal interconnects 54 and 56. The interface contact areas 68 and 69 provide connections between the second level metal interconnects 54 and 56 and the respective capacitor bottom plate electrodes 42 and 40. The bit line contact 70 provides a connection to the common transistor source region 38 via the first level interconnect 18. In like manner, the drive line interface contact area 72 provides a connection between the drive line 16 and the single top capacitor plate 46. An efficiency in the utilization of semiconductor area is realized by the single bit line interface contact area 70 with the two memory cells 10 and 28 as well as the single drive line interface contact area 72 to the single top capacitor plate 46 associated with both such cells. The outline 74 of FIG. 2 essentially defines the boundary of the memory cell pair 30, and in the preferred embodiment of the invention, comprises only about 50-60 square microns of silicon area. This cell area contrasts with about 450 square microns of wafer area required of two cells constructed according to prior techniques.

Figure 4:
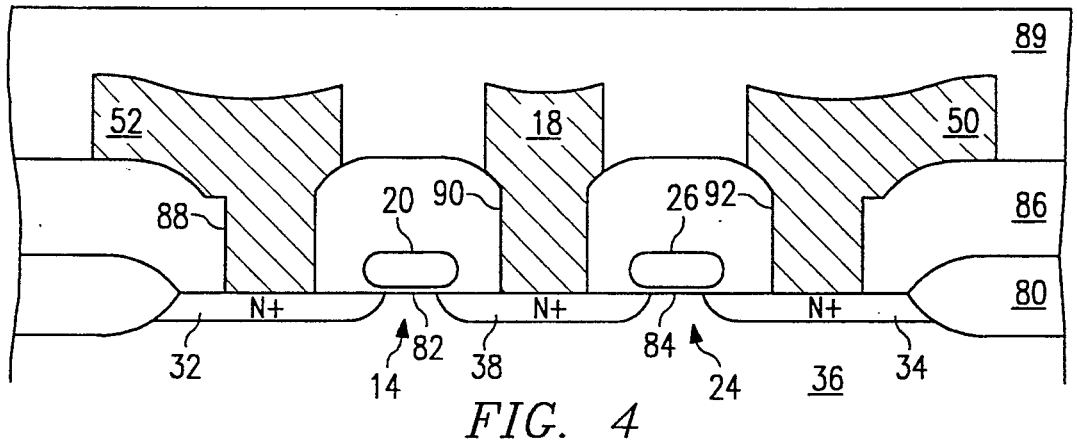
FIGS. 4–12 illustrate cross-sectional views of a wafer during various steps of the processing technique of the invention.

With reference now to FIG. 4, there is shown a cross-sectional view of a semiconductor wafer, subsequent to the formation of the pair of select transistors 14 and 24, and subsequent to the formation and patterning of the first metallization layer. The processing steps carried out to achieve the structure of FIG. 4 are well known, and thus those skilled in the art are familiar with the equipment and techniques for fabricating the MOS-type transistors in semiconductor substrates. In the preferred embodiment, transistors 14 and 24 are N-channel transistors formed in a p-type substrate 36 with heavily doped n-type drain regions 32 and 34. During the same masking and processing steps, the common heavily doped n-type source region 38 is also formed. The source and drain regions are preferably formed self-aligned with respect to the polycrystalline silicon word lines 20 and 26. Of course, a thick field oxide 80 surrounds the dual transistor area. The gate insulator 82 and 84 is formed by the thermal oxidation of the silicon substrate for a prescribed period of time to form an insulator of desired thickness. A doped polycrystalline silicon is deposited over the surface of the wafer, patterned and etched to define the conductive word lines 20 and 26. The word lines 20 and 26 also function as the gate electrodes for each of the transistors, and extend along the array in parallel with the drive line 16.

After formation of the word lines 20 and 26, a thick layer 86 of silicon dioxide is deposited over the surface of the wafer to electrically isolate the word lines 20 and 26. The silicon dioxide layer 86 is patterned to form vias 88, 90 and 92 for exposing the transistor drain regions 32 and 34 as well as the common source region 38. Then, a thin barrier layer (not shown) of titanium nitride or titanium tungsten alloy is sputter deposited in the via and on the exposed silicon areas 32, 34 and 38 to prevent undesired reactions between the silicon material and tungsten which forms the first level metal. Thereafter, a layer of tungsten, or other suitable refractory metal, or an alloy thereof, is deposited over the wafer by chemical vapor deposition, or otherwise, and patterned by masking and etching to form the interconnects 50 and 52, as well as the elongate bit line 18. A metal, such as a refractory metal is desirable for the first level metal to withstand the subsequent high temperature processing of the ferroelectric material. As noted, the refractory first level metal makes intimate contact with the barrier layer to the transistor source and drain regions. Preferably, the refractory metal layer is deposited by chemical vapor deposition (CVD) techniques.

A second layer 89 of silicon dioxide is deposited over the processed wafer to serve two functions. First, the silicon dioxide layer 89 passivates the underlying layers and isolates the tungsten first level interconnect tungsten metal from subsequent processes and materials.

Secondly, the silicon dioxide insulating layer 89 provides a mechanism for planarizing the surface of the wafer for subsequent processing to form the ferroelectric capacitors. Planarization is carried out in a conventional manner, such as by utilizing a photoresist material that is matched with silicon dioxide 89 as to the etch rate so that the etching thereof results in a smooth and planar surface. Other planarizing techniques can be used with equal effectiveness.

Figure 5:
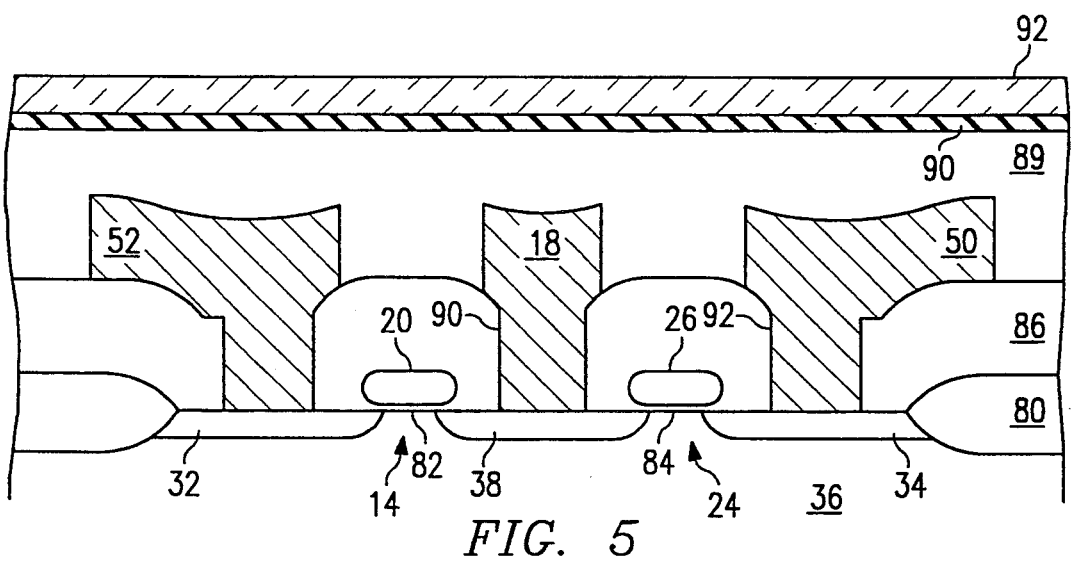

FIG. 5 depicts the semiconductor wafer subsequent to other processing steps. Particularly, about 50–100 nm of silicon nitride 90 is deposited on the planarized surface of the wafer. The silicon nitride 90 is preferably deposited by low pressure chemical vapor deposition (CVD) techniques. The silicon nitride layer 90 functions to protect the underlying devices from potential contamination during processing of the ferroelectric capacitor dielectric. Deposited on the silicon nitride layer 90 is a layer 92 of titanium. Preferably, a layer of about 100–150 nm of titanium is deposited by sputtering a titanium target. The titanium layer 92 is oxidized for about 30 minutes in an oxygen ambient at about 650° C. to form titanium oxide. The titanium oxide functions as a reaction barrier to protect the underlying layers from chemical reactions with the subsequently formed ferroelectric dielectric material during the ferroelectric sintering step. Alternate materials for use in forming the reaction barrier 92 include titanium nitride, zirconium oxide, and zirconium nitride.

Figure 6:
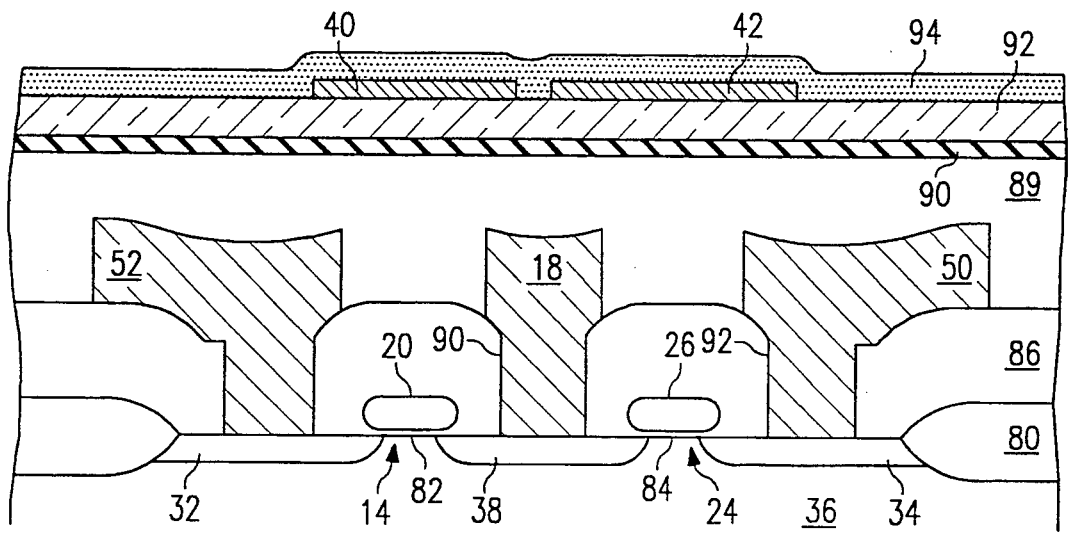

With regard to FIG. 6, the process steps are illustrated for forming the capacitor bottom electrodes that define the bottom plates of the ferroelectric capacitors 12 and 22. A layer of ruthenium is deposited on the processed substrate to a thickness of about 50–80 nm, and patterned by masking and etching to form two square or rectangular surface plates 40 and 42. The plates 40 and 42 define the split bottom capacitor plates. Particularly, the ruthenium bottom plates 40 and 42 are masked using a titanium hard mask, on which a photoresist material is spun and exposed to define the surface areas corresponding to the shape of the bottom plates 40 and 42. The photoresist is developed and the undesired portions removed, and thereafter the titanium hard mask is dry etched to form the desired surface area shapes of the titanium mask. The photoresist is stripped from the surface of the wafer. Thereafter, the ruthenium layer that is exposed by the titanium mask is sputter etched, leaving the ruthenium bottom plates 40 and 42. Subsequently, the titanium overlying the ruthenium plates 40 and 42 is removed by a conventional wet strip process. As can be appreciated, the area of each of the bottom plates 40 and 42 can be of a desired area depending upon the capacitance desired of the ferroelectric capacitors 12 and 22. Alternate materials of the ruthenium bottom electrode material include platinum, palladium and conductive oxides such as chromium oxide and ruthenium oxide. These materials remain conductive, even after oxidation thereof, which naturally occurs during the sintering process of the ferroelectric material, to be described below.

A ferroelectric material 94 is next deposited on the surface of the wafer to form the polarizable dielectric of the memory cell capacitors. Those skilled in the art can readily appreciate that many different types of ferroelectric materials are available, as are techniques for depositing the material on the wafer. In the preferred embodiment, a PZT type of ferroelectric material, in a sol-gel form, is spun on the surface of the wafer to a depth of about 200–800 nanometers. Again, the resultant thickness of the ferroelectric material 94, after the high temperature sintering process, is a function of the capacitance desired of the ferroelectric capacitors. Other ferroelectric deposition processes may include sputter depositing, chemical vapor deposition or laser ablation. After the ferroelectric material 94 has cured, it is next subjected to a high temperature sintering environment to crystallize the material so that it achieves a hysteresis characteristic and is thus polarizable to desirable states. The sintering process is carried out for about 60 seconds in an air ambient temperature of about 775° C. Depending upon the type of dielectric material employed, sintering temperatures may range between about 500° C.–850° C., and time periods may range from 30 seconds to 30 hours, depending upon the sintering temperature.

Figure 7:
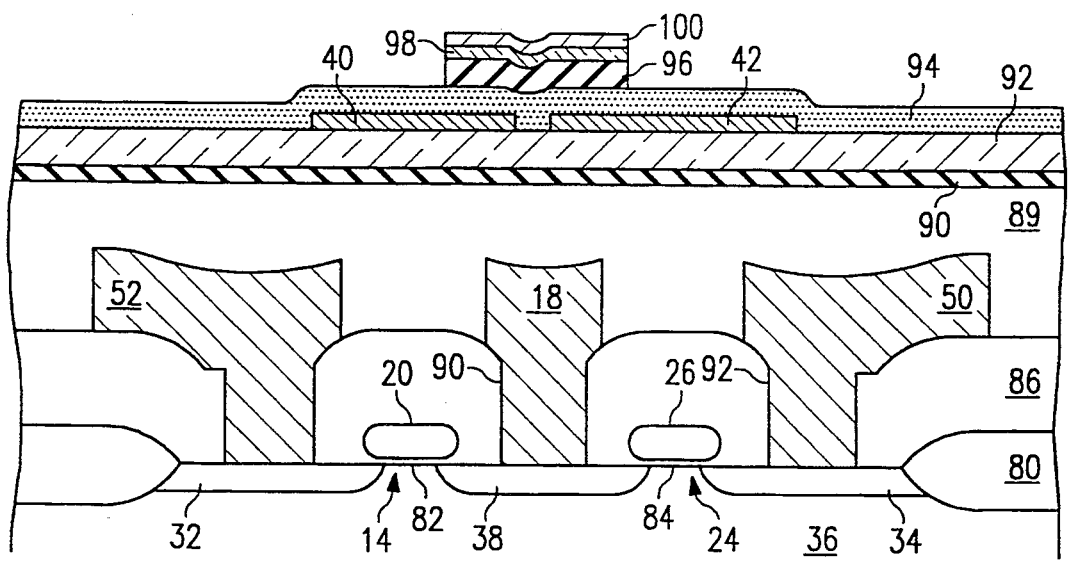

With reference to FIG. 7, a layer 96 of ruthenium is sputtered over the surface of the sintered ferroelectric material 94, in an oxygen ambient, to form a layer of ruthenium oxide having a thickness of about 30–60 nm. The thin layer of ruthenium oxide 96 is transparent. Thereafter, another layer of ruthenium 98 is sputtered on the ruthenium dioxide layer 96, to a depth of about 25–35 nm. Deposited over the ruthenium layer 98 is a layer 100 of titanium which will function as a hard mask for subsequent etching of the ruthenium and ruthenium oxide layers 96 and 98. The titanium layer 100 is deposited to a depth of about 100–120 nm. Again, an alternative material to form the top electrode 96 and 98 is platinum. FIG. 7 illustrates the memory wafer after the masking and etching steps, in which the titanium 100 is first masked with a photoresist and etched, and thereafter the patterned titanium 100 forms an etch mask for the underlying ruthenium 98 and ruthenium oxide 96 layers which are sputter etched. The sputter etching of the ruthenium materials is selective, and does not affect the ferroelectric layer 94 which remains over the entire surface of the wafer. The titanium hard mask layer 100 is then removed by wet etch techniques.

Figure 8:
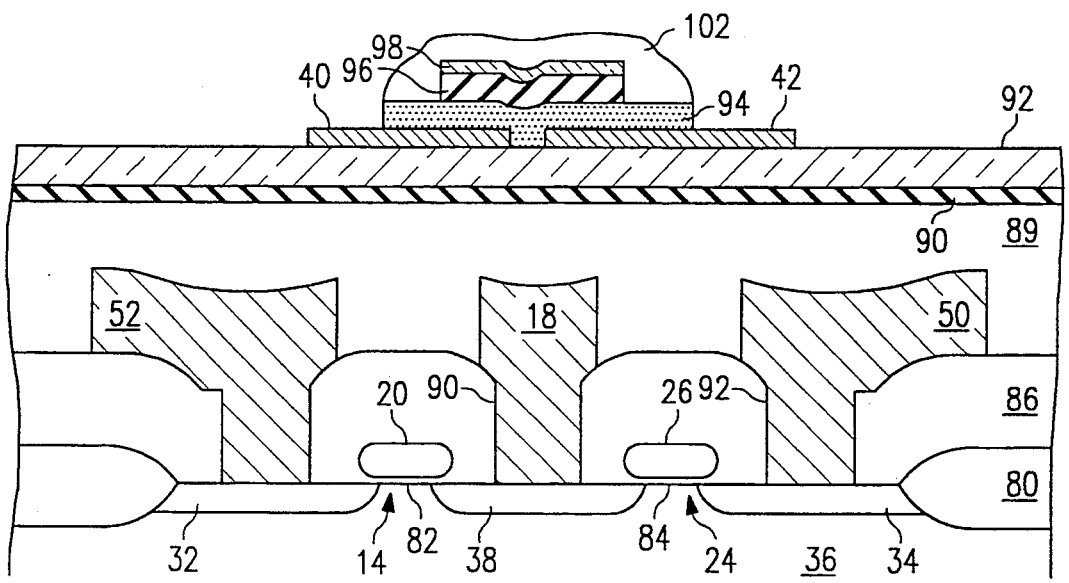
Figure 9:
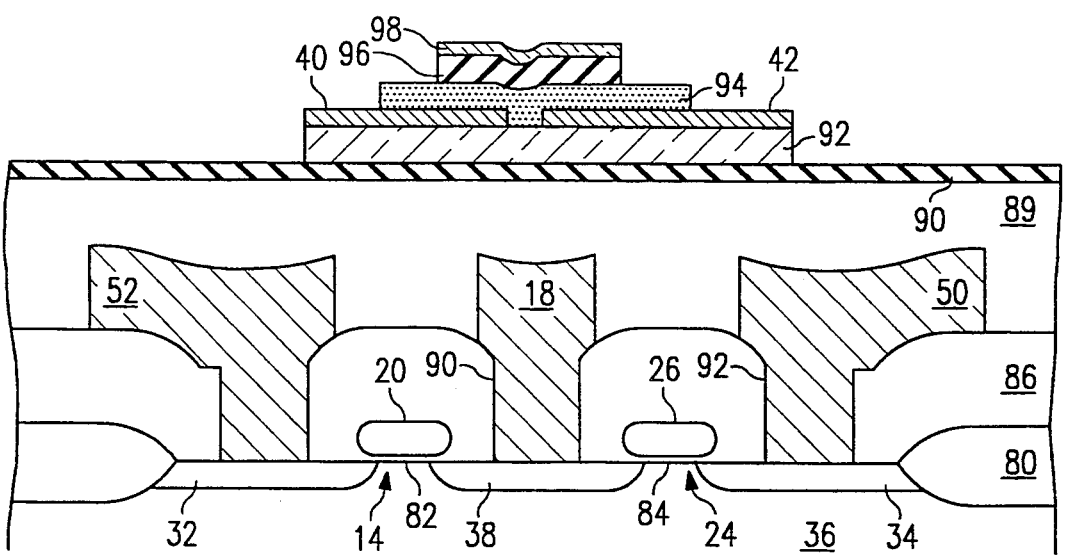

The next processing step involves the patterning of the ferroelectric material layer 94. A photoresist layer 102 shown in FIG. 8 is spun over the wafer and patterned in the manner shown. Importantly, the photoresist mask 102 is patterned so as not to overlap the entire bottom plates 40 and 42, thereby leaving a surface area for forming second metal interconnects in contact therewith. After patterning the photoresist mask 102, the exposed ferroelectric material layer 94 is etched to remove all exposed portions thereof. The ferroelectric material 94 can be wet or dry etched by conventional techniques. Thereafter, the wafer is subjected to a dry etch in which the exposed titanium dioxide layer 92 is also removed. The ruthenium oxide bottom plates 40 and 42 also function as a mask for the dry etching of the titanium dioxide layer 92. As a result of the etching steps, the wafer topology is shown in FIG. 9.

Figure 10:
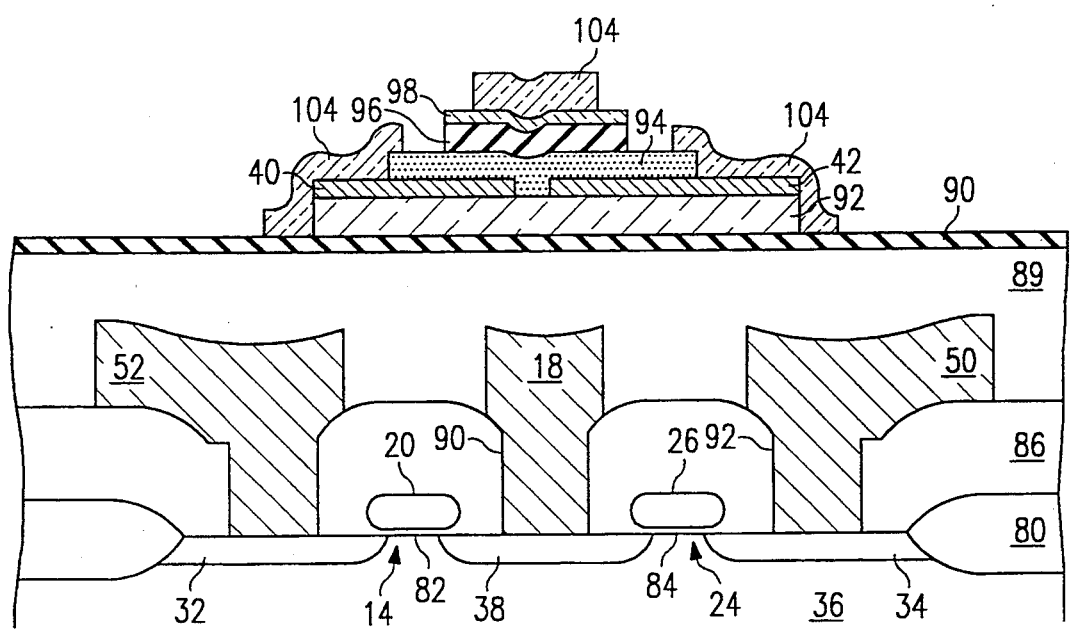

In accordance with another feature of the invention, a second ruthenium top plate 104 is formed on the preceding dual ruthenium layers 96 and 98. This is shown in FIG. 10. As noted, the second layer 104 of ruthenium is also patterned to contact exposed portions of the bottom plates of the ferroelectric capacitors. The second top plate 104 functions as a barrier to a subsequently deposited second level metal interconnect and the ruthenium oxide bottom plate electrode. Otherwise, the second level metal (aluminum) would chemically reduce the ruthenium oxide to ruthenium and form an aluminum oxide that is electrically insulating at its surface. In the event that platinum is chosen for the capacitor plate electrodes rather than ruthenium, the second top plate electrode structure is not required.

In providing a second top capacitor plate, the layer of ruthenium 104 is sputter deposited over the wafer to a thickness of about 50–80 nm. Then, a titanium hard mask (not shown) is deposited, patterned and etched to form a mask for the ruthenium second top plate 104. In addition, the titanium is patterned using a resist mask, and thereafter dry etched. The photoresist for the titanium mask is then removed, whereupon the exposed ruthenium layer 104 is sputter etched. As noted in FIG. 10, the second top plate material 104 also covers and protects the exposed edges of the bottom plates 40 and 42.

In accordance with conventional semiconductor wafer processing techniques, the front of the wafer is covered with a photoresist and the back side of the wafer is dry etched to clean unwanted materials from the wafer back side. The photoresist is then stripped from the front side of the wafer, and the previously deposited titanium hard mask is stripped by a wet etch from the second top plate 104, as cross-sectionally illustrated in FIG. 10.

Figure 11:
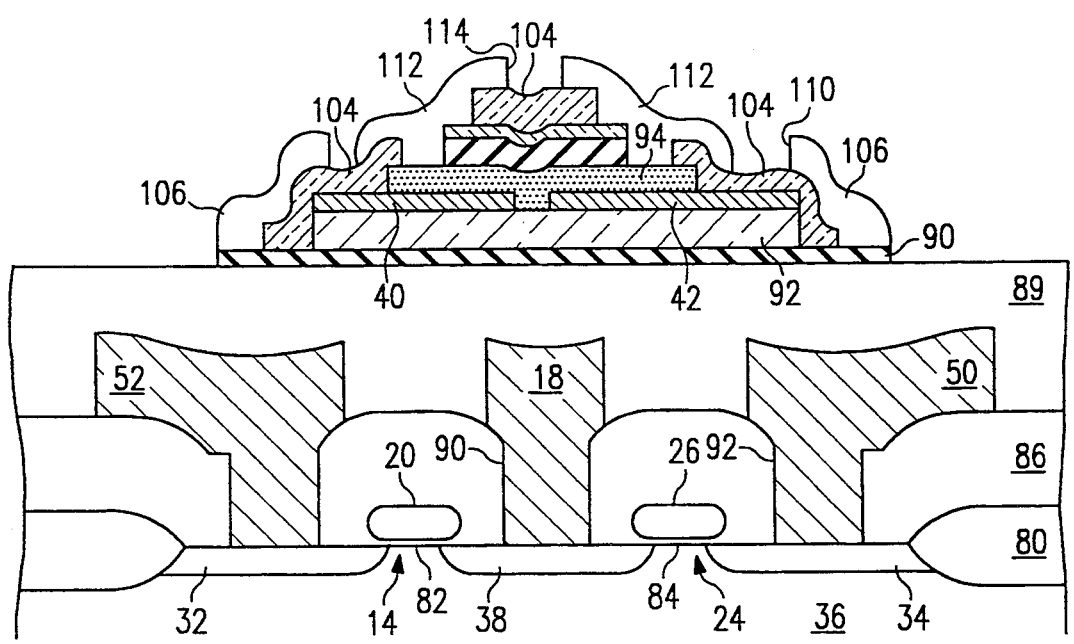

FIG. 11 illustrates a cross section of the processed semiconductor wafer after the deposition and patterning of an interlevel dielectric 106. The interlevel dielectric 106 is preferably deposited to a depth of about 300–500 nm by a low temperature oxidation deposition process. The interlevel dielectric 106 preferably comprises silicon dioxide that is patterned and etched to form contact vias 110 and 112 for providing metal connection pathways to the bottom plates 40 and 42 by way of the conductive layers 104, and to form a via 114 to provide an opening for a metal connection to the second top plate 104. The interlevel dielectric 106 is etched to form the noted vias, and in addition, the contamination barrier layer 90, comprising silicon nitride, is also etched. The result of these processing steps is depicted in FIG. 11. The photoresist is then stripped from the patterned surface of the wafer.

Figure 12:
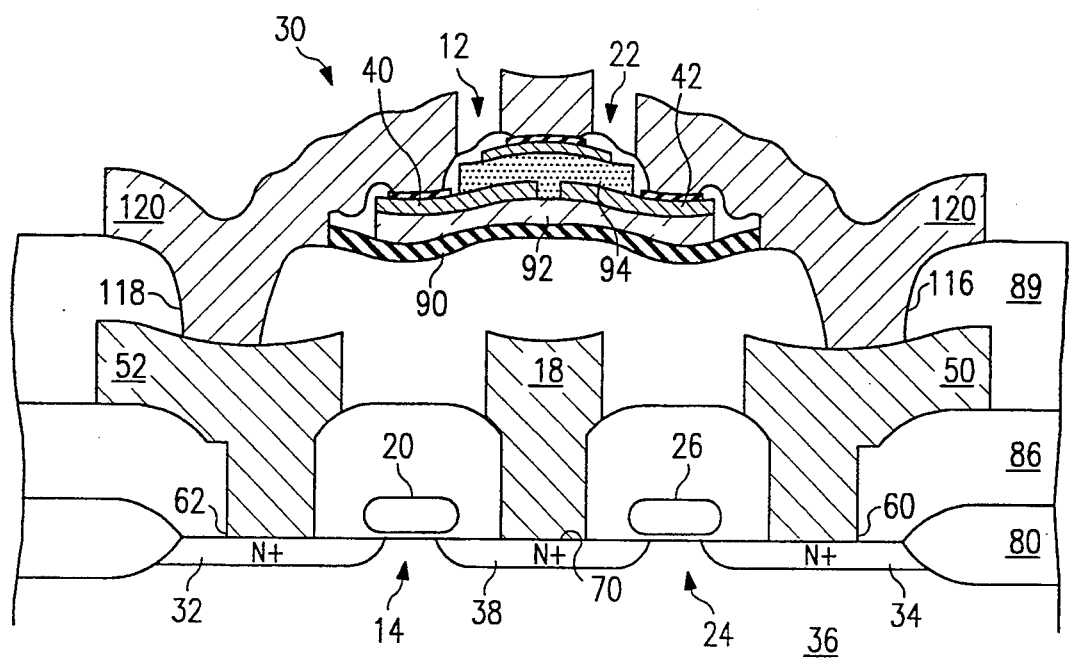

Continuing with the wafer processing steps according to the invention, another masking step is carried out with photoresist to define openings in the second level deposited oxide layer 89 for providing connection pathways to the first level interconnect structures 18, 50 and 52. The deposited oxide 89 is etched to form the vias 116 and 118 shown in FIG. 12. The photoresist mask is then stripped from the surface of the wafer, whereupon a second level metal 120 is deposited over the surface of the wafer. Preferably, the second level metal 120 is aluminum or an alloy thereof, such as AlCuSi, or other conductive material suitable for forming integrated circuit conductors. The second level metallization layer 120 is preferably sputter deposited to a depth of 0.8–1.5 microns. Then, an additional photoresist masking and patterning step is carried out to define the pattern of the second metal interconnect layer 120. The wafer is then dry etched to remove the unmasked, exposed portions of the aluminum layer 120. The photoresist mask is then stripped from the wafer. The resulting processed wafer is shown in FIG. 12. The wafer is then heated to a temperature of about 400° C. for 30 minutes to alloy the second level interconnect metallization layer 120.

As noted in FIG. 12, the ferroelectric capacitors 12 and 22 are formed overlying the respective select transistors 14 and 24, and are interconnected by the first and second level metallization connections 50, 120 and 52, 120. A highly compact memory cell arrangement is realized and requires substantially less area than ferroelectric memory cells heretofore known.

Figure 13A:
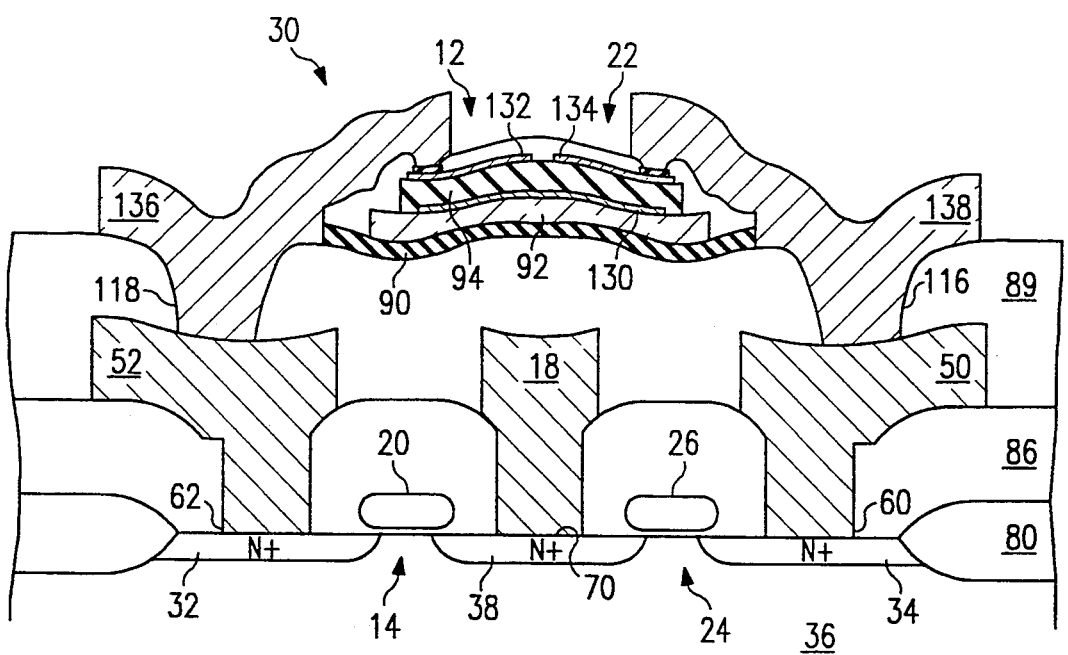
FIGS. 13a and 13b illustrate respectively cross-section and top plan views of another embodiment of the memory cell architecture of the invention employing a split top capacitor plate.
Figure 13B:
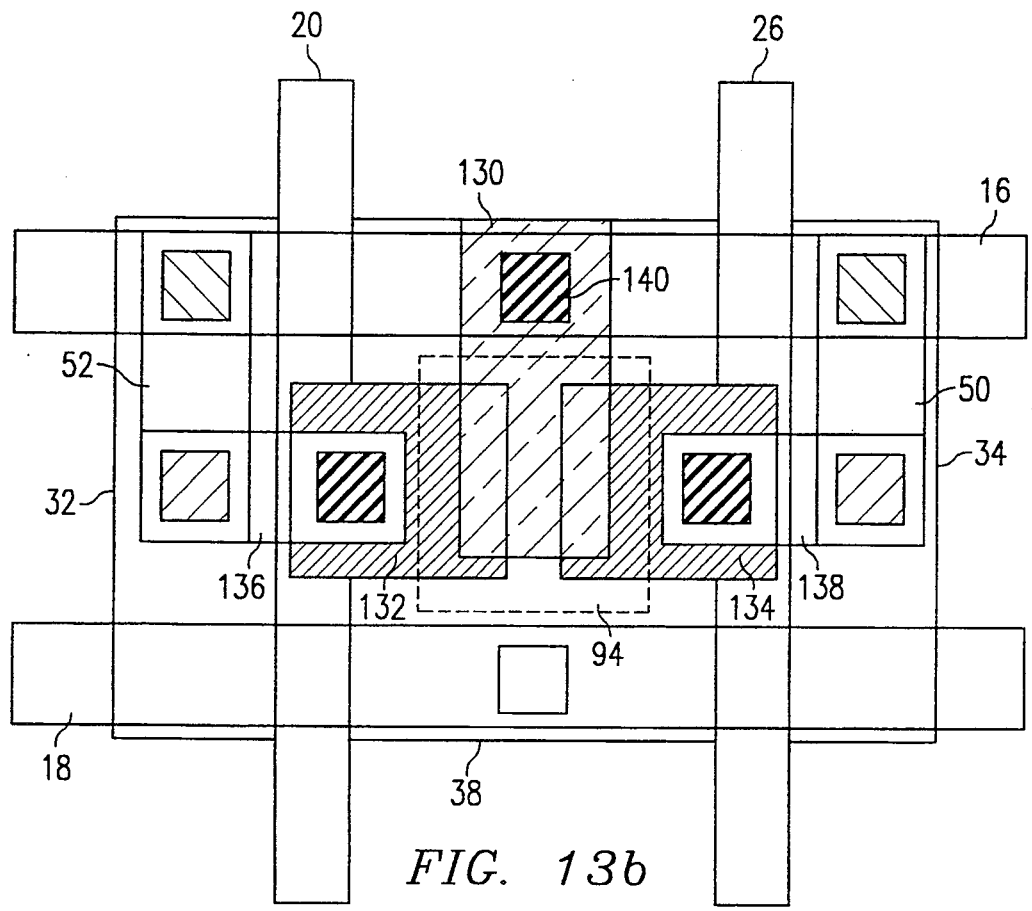

From the foregoing disclosure, those skilled in the art may find that variations of the principles and concepts of the invention are possible. One such variation is shown in FIGS. 13a and 13b as a similar pair of ferroelectric memory cells having common semiconductor areas and metal layers such as that noted in FIG. 3, but having a common bottom capacitor plate 130 and split top capacitor plates 132 and 134. In this embodiment, the second level metallization elements 136 and 138 are connected to the respective top capacitor plates 132 and 134. In addition, and not shown, the drive line is connected to the common bottom plate 130 of the ferroelectric capacitors at a location shown by reference numeral 140. It is noted that in this embodiment the plate line 16 and the bit line 18 extend along the array in a parallel manner, perpendicular to the word lines 20 and 26. By constructing the plate lines perpendicular to the word lines, a single cell of the array, rather than an entire row, can be accessed to read a single bit of data out of the memory. It is understood that a plate line decoder and a word line decoder are utilized to decode an address and provide signals on the decoded plate and word lines.

Figure 14:
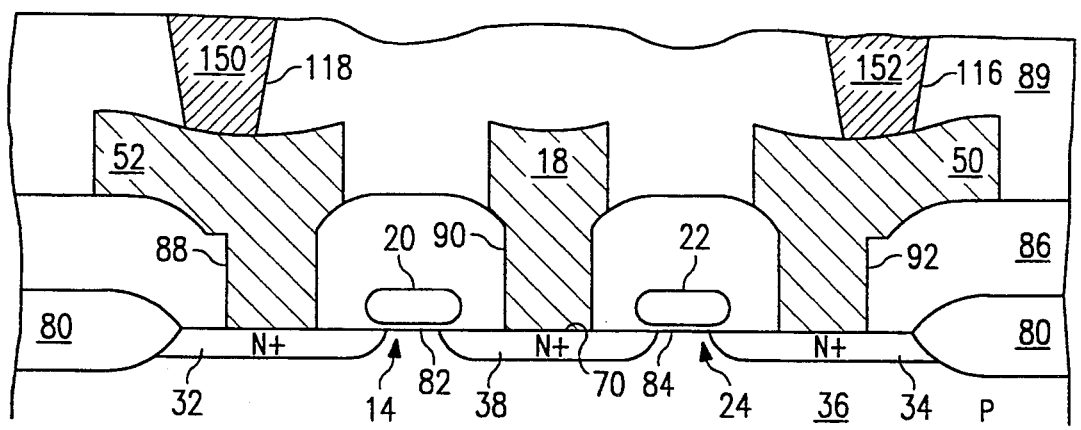
FIGS. 14–16 are cross-sectional views of another embodiment of the invention utilizing conductive plugs for interconnecting the ferroelectric bottom capacitor plates to the first level metallization layer.
Figure 15:
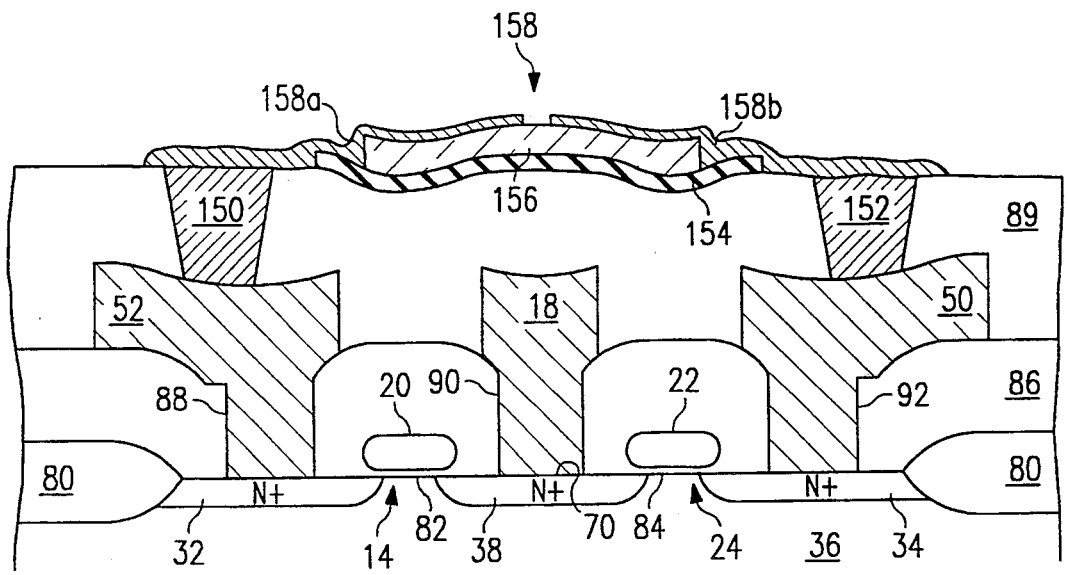
Figure 16:
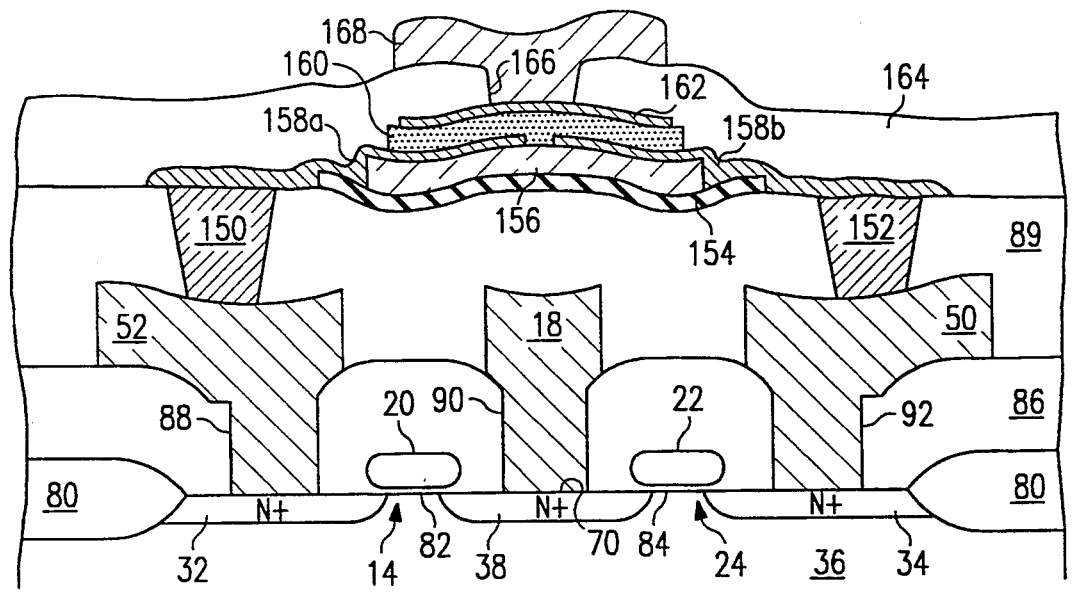

A further cell simplification and economy of wafer area can be achieved by utilizing the cell architecture and processing technique illustrated in FIGS. 14–16. In this embodiment, vertical conductive plugs are utilized for interconnections, rather than the second level metallization, thereby realizing a further decrease in the area required of a memory cell pair. In this scheme, a top or surface interconnection to the bottom plates of the capacitors is generally not available.

The steps in fabricating this embodiment are similar to those described above in connection with the processing of the wafer shown in FIG. 4 to form the first level interconnects 50 and 52, as well as the bit line 18. The wafer processing continues as shown in FIG. 14, in which the layer 89 of deposited silicon dioxide is formed over the first metallization that has been patterned as interconnects 50 and 52, and the bit line 18. The deposited isolation layer 89 is then masked and patterned to form openings 116 and 118 in the manner described above. The openings in the isolation layer 89 are formed so as to expose at least a portion of the underlying first level metallization interconnects 50 and 52. Then, a tungsten material, or other conductive material suitable for high temperature processing, is deposited over the isolation layer 89 and planarized so that only the resulting plugs 150 and 152 remain. While not shown, a similar plug can be formed through the isolation layer 89 in contact with the bit line 18 for subsequent connection.

The ferroelectric memory wafer of the invention is further processed as shown in FIG. 15 by depositing and patterning a silicon nitride layer 154 which functions as a barrier to prevent contamination of the underlying layers with the ferroelectric material that is deposited in subsequent process steps. Deposited, masked and patterned on the barrier layer 154 is a layer 156 of titanium oxide which also comprises a reaction barrier between the ferroelectric materials and the underlying layers. Next, a bottom capacitor plate 158 is formed on the surface of the wafer, masked and patterned to define a first bottom capacitor plate 158a and a second bottom capacitor plate 158b. Importantly, the bottom capacitor plates 158a and 158b are deposited in intimate contact with the exposed surfaces of the respective interconnect plugs 150 and 152. Before depositing the bottom capacitor plate electrode material, the exposed surfaces of the interconnect plugs 150 and 152 may require surface cleaning or etching to provide a low-resistance interconnection to the bottom capacitor plate material. In the preferred form of the invention, the bottom capacitor plates 158a and 158b are formed by depositing a ruthenium material on the wafer. It is believed that ruthenium will form an intimate contact with tungsten interconnect plugs 150 and 152. Thereafter, the ruthenium is subjected to an oxidizing ambient, in which the upper exposed surface of the ruthenium oxidizes to form ruthenium oxide. These processing steps can be carried out in a manner similar to that described above.

FIG. 16 illustrates a sectional view of a completed memory cell pair, subsequent to the processing steps described below. A PZT or other type of ferroelectric material 160 is spun or otherwise deposited on the surface of the wafer and patterned so as to cover at least a portion of the split bottom electrode 158. A top capacitor plate 162 comprising ruthenium oxide and/or ruthenium, as described above, is deposited, masked and patterned overlying the ferroelectric dielectric 160. A surface insulation 164, such as deposited silicon dioxide, is then formed on the surface of the wafer, masked and patterned to define an opening 166 to the top capacitor plate 162. An aluminum metal or alloy thereof is then deposited, masked and patterned to define a surface conductor 168 in contact with the top capacitor plate 162. As noted in FIG. 16, the bottom capacitor plates 158a and 158b are not generally available as surface conductors, as are the embodiments shown in FIG. 12. However, by forming the interconnect plugs 150 and 152 rather than the full second level metallization, the strict adherence to design rules attendant with the formation of the second level metallization can be avoided, thereby realizing a memory cell of even smaller area. Indeed, the embodiment illustrated in FIG. 16 is believed to require about 35% reduction in semiconductor area, as compared to the embodiment illustrated in FIG. 12. Those skilled in the art may prefer to fabricate the ferroelectric capacitor with plates having a larger area than those shown in FIG. 16, thereby achieving a larger capacitance without substantially compromising the area of the ferroelectric memory cell.

While the preferred and other embodiments of the invention have been disclosed with reference to specific memory cell architectures and processing techniques, it is to be understood that many changes in detail may be made as a matter of engineering choices without departing from the spirit and scope of the invention, as defined by the appended claims.

What is claimed is:

1. A method for fabricating a ferroelectric memory, comprising the steps of:
   forming a pair of select transistors in a semiconductor material, each said transistor having a drain region and a source region;
   forming a ferroelectric capacitor structure comprising two distinct ferroelectric capacitors overlying said pair of transistors, including forming a top plate, a bottom plate and a ferroelectric material therebetween, further including forming one of said capacitor plates with a layer of a conductive material having two plates laterally spaced apart and isolated from each other so as to define a pair of capacitor plates, and forming the other capacitor plate as a single plate that is vertically spaced from the pair of capacitor plates with the ferroelectric material disposed therebetween, said single capacitor plate being shared with both transistors;
   forming respective first level interconnect elements in contact with a drain region of each said transistor;
   forming respective second level interconnect elements that are different from said capacitor plates, in contact with said first level interconnect elements;
   forming said second level interconnect elements in contact with respect to said pair of capacitor plates; and
   forming a conductor in contact with the single capacitor plate that is not split.

2. The method of claim 1, further including forming a common source region shared by said pair of transistors.

3. The method of claim 1, further including forming said first level interconnect with a refractory metal before depositing said ferroelectric material on said bottom capacitor plate.

4. The method of claim 1, further including forming said capacitor with top and bottom plates having areas thereof exposed for connection to said second level metal interconnect, and forming a layer of ruthenium on said exposed areas and forming an aluminum alloy as said second level interconnect.

5. The method of claim 1, further including forming said bottom plate on a ruthenium oxide layer and forming said ruthenium oxide layer on a titanium oxide layer.

6. The method of claim 5, further including forming said titanium oxide layer on a layer of silicon nitride.

7. The method of claim 1, further including forming said bottom capacitor plate as a split electrode by forming a layer of conductive material, and etching the conductive material to form two distinct and isolated conductive plates.

8. The method of claim 1, further including forming said top capacitor plate as a split electrode by forming a Layer of conductive material, and etching the conductive material to form two distinct and isolated conductive plates.

9. The method of claim 1, further including forming a single drive line conductor in electrical contact with the single capacitor plate so that one drive line drives the pair of ferroelectric capacitors.

10. A method of fabricating a ferroelectric memory, comprising the steps of:
   forming a pair of MOS transistors in a semiconductor material, each said transistor having a drain region and a common source region;
   forming a respective word line in contact with a gate of each said transistor;
   forming a bit line in contact with said common source region;
   forming a first level refractory metal contact to the respective drain regions;
   forming an isolation layer isolating said first level metal;
   forming a pair of ferroelectric capacitors overlying said isolation layer and over said transistors, each said ferroelectric capacitor having a bottom plate, a ferroelectric dielectric and a top plate;
   forming respective second metal contacts for connecting one plate of each said capacitor to the respective first level metal to thereby connect one said ferroelectric capacitor to a respective transistor, the forming of the second metal contacts being carried out after forming a ferroelectric material into a ferroelectric dielectric; and
   forming a metal contact to the other plates of each said ferroelectric capacitor, said metal contact defining a drive line.

11. The method of claim 10, wherein each said capacitor has a split metal layer defining separate capacitor plates, a common layer of ferroelectric material and a single metal layer defining a capacitor plate common to both said capacitors.

12. A method of fabricating a ferroelectric memory, comprising the steps of:
   forming a transistor in a semiconductor material;
   forming a first isolation layer over said transistor;
   forming a refractory interconnection through the first isolation layer in contact with a region of said transistor;
   forming a second isolation layer for isolating the refractory interconnection;
   forming a bottom capacitor plate at least partially overlying said transistor;
   forming a top capacitor plate and a ferroelectric dielectric between the top and bottom capacitor plate;
   sintering the ferroelectric material at a high temperature to form a polarizable dielectric;
   forming an intermediate nonrefractory interconnect plug of a conductive material after said ferroelectric sintering and forming said nonrefractory interconnect plug distinct from said refractory interconnection for connecting interconnection to said bottom capacitor plate is said bottom capacitor plate is electrically connected via said intermediate interconnect plug through the second isolation layer in contact with said refractory interconnection so that said bottom capacitor plate is electrically connected to the transistor; and
   forming a conductor in contact with said top capacitor plate.

13. The method of claim 12, further including forming said bottom capacitor plate with ruthenium.

14. The method of claim 13, further including forming the bottom capacitor plate as a first layer of oxidized ruthenium and a second layer of ruthenium over said ruthenium oxide, and wherein said second layer of ruthenium is formed in electrical contact with said nonrefractory interconnect plug.

15. A method of fabricating a ferroelectric memory, comprising the steps of:
   forming a pair of transistors in a semiconductor material, said transistors having a common source region and different drain regions;
   forming an electrical isolation over said transistors;
   forming a first interconnection through said isolation in contact with one transistor drain region and a second interconnect through said isolation in contact with the other transistor drain region;
   forming a split bottom capacitor plate overlying said transistors, including forming a first split bottom plate in electrical contact with said first transistor interconnection and forming the second split bottom plate in electrical contact with the second transistor interconnection;
   forming one top capacitor plate overlying at least a portion of each said first and second split bottom plates and forming a ferroelectric material between the top capacitor plate and the split bottom capacitor plates; and
   forming a conductor in contact with said One top capacitor plate.

16. The method of claim 15, further including forming a top capacitor plate as a unitary layer common to said split bottom capacitor plates, whereby a pair of ferroelectric capacitors are formed.

17. The method of claim 15, further including forming respective intermediate conductive plugs distinct from said first interconnections between said first and second bottom capacitor plates and the respective transistor interconnections.

18. A method of fabricating a ferroelectric memory, comprising the steps of:
   forming a pair of MOS transistors in a semiconductor substrate, said transistors having a common source region and different drain regions;
   forming a different word line as a gate structure for each said transistor;
   forming a dielectric overlying said transistor pair;
   forming a first level metal and patterning the first level metal to define a first metal interconnect and a second metal interconnect through said dielectric and connected respectively to said different drain regions, and to define a third metal interconnect through said dielectric and connected to said common source region, said first, second and third interconnects being isolated from each other;
   forming a ferroelectric capacitor overlying said dielectric, including forming a top electrode and a bottom electrode with a ferroelectric dielectric therebetween, and forming one said top or bottom electrode as a split electrode to define two electrode conductors isolated from each other, the other electrode and ferroelectric dielectric being common thereto;
   forming said ferroelectric capacitor with lateral dimensions such that a lateral dimension of said bottom plate structure is wider than a lateral dimension of said ferroelectric material, and the lateral dimension of the ferroelectric material is wider than a corresponding lateral dimension of said top electrode;
   forming a second level metal and patterning the second level metal to interconnect one split electrode to the first metal interconnect, and patterning said second level metal to interconnect the other split electrode to the second metal interconnect; and passivating the ferroelectric memory.

19. The method of claim 18, further including forming an insulation layer over said first level interconnects and forming the second level metal interconnects therethrough to the respective first level metal interconnects.

20. The method of claim 18, further including forming said capacitor top and bottom electrodes with ruthenium.

21. The method of claim 18, further including forming a layer of ruthenium material on a portion of said bottom electrode and on said second top electrode, said ruthenium functioning to provide a barrier to said portion of said bottom electrode.

22. The method of claim 21, further including forming said ruthenium material over a portion of the bottom electrode which comprises ruthenium oxide.

23. The method of claim 21, further including masking said ruthenium material with titanium and etching an opening in the ruthenium material to electrically isolate the capacitor top and bottom electrodes.

24. The method of claim 23, further including forming an insulating material in the isolation opening in said ruthenium material.

25. The method of claim 24, further including forming said second level metal interconnect in contact with both said first level metal interconnect and said ruthenium material that contacts said bottom electrode.

26. The method of claim 18, further including forming said bottom electrode with a bottom layer of ruthenium oxide and a top layer of ruthenium.

27. The method of claim 18, further including forming a titanium oxide barrier layer and a silicon nitride barrier layer between said ferroelectric capacitor and the semiconductor transistors.

28. A method of fabricating a ferroelectric memory cell, comprising the steps of:
  forming a pair of MOS transistors in a semiconductor substrate, said transistors each having a drain region spaced apart from each other, a common source region located between the spaced apart drain regions, and a gate conductor;
  forming a first metal level as individual contacts to the transistor drain regions and the common source region;
  forming an electrical insulation for electrically isolating said individual contacts;
  forming one conductive plate overlying said common source that functions as a plate for two ferroelectric capacitors;
  forming a pair of second capacitor plates, each second capacitor plate being spaced vertically from said one conductive plate;
  forming a ferroelectric material between said one conductive plate and said pair of second capacitor plates, thereby defining the two ferroelectric capacitors;
  forming a drive line in contact with said one conductive plate for allowing a single drive signal to be coupled to both said ferroelectric capacitors; and
  forming an electrical connection between the respective pair of second capacitor plates and the transistor drain regions.

29. The method of claim 28, further including forming the one conductive plate overlying the pair of second capacitor plates.

30. The method of claim 28, further including forming the one conductive plate underlying the pair of second capacitor plates.

31. The method of claim 28, further including forming the pair of second capacitor plates by depositing a layer of conductive material and removing a portion thereof to electrically isolate lateral portions thereof and thereby define a pair of isolated plates.

32. The method of claim 28, further including forming the electrical connections between the pair of second capacitor plates and the respective transistor drain regions by forming a conductive material after sintering of the ferroelectric material, and forming the pair of second capacitor plates and refractory metal interconnections in contact with the respective transistor drain regions.

33. The method of claim 32, further including forming the pair of second capacitor plates so as to extend laterally beyond respective lateral edges of the one conductive plate, and forming the conductive material in contact with an upper surface of a part of each plate of the second capacitor pair that extends laterally beyond the one conductive plate.

34. The method of claim 28, further including forming the electrical connections between the respective pair of second capacitor plates and the transistor drain regions by forming respective refractory metal contacts to the transistor drain regions, forming a different conductive plug overlying the refractory metal contacts and in contact therewith; and thereafter forming respective capacitor plates for each said ferroelectric capacitor in contact with the respective conductive plugs.

35. A ferroelectric memory fabricated in accordance with the method of claim 1.

36. A ferroelectric memory, comprising:
  a pair of transistors formed in a semiconductor material, each said transistor having a drain region and sharing a common source region;
  a pair of first level metal interconnects formed in contact with each said drain region, and being isolated;
  an insulation formed over said transistor and around said first level interconnects;
  a ferroelectric capacitor structure disposed over said transistors and having a top and bottom plate with ferroelectric material formed therebetween, one said capacitor plate being split to form two laterally spaced apart plates; and
  a pair of second level interconnects isolated from each other, each second level interconnect connecting one said first level interconnect to a respective capacitor plate.

37. The ferroelectric memory of claim 36, wherein said top plate is split.

38. The ferroelectric memory of claim 36, wherein said bottom plate is split.

39. The ferroelectric memory of claim 36, further including a single bit line connected to said common source region.

40. The ferroelectric memory of claim 39, wherein said bit line is fabricated in said insulation with said first level interconnects.

41. A ferroelectric memory fabricated in accordance with the method of claim 12.

42. A ferroelectric memory cell structure, comprising:

a pair of transistors formed in a semiconductor material, each transistor having a drain region and sharing a common single source region;

a common conductive drive line shared by both said transistors;

a pair of ferroelectric capacitors, each having a first plate connected to a respective transistor drain region, and each having a second plate connected to said common drive line;

said pair of ferroelectric capacitors include a common single dielectric of ferroelectric material and a common single one of said first or second plates;

a common bit line connected to the common source region of said transistors; and a pair of word lines, each connected to a different gate structure of said transistors.

43. The ferroelectric memory cell structure of claim 42, wherein each said ferroelectric capacitor includes one of said first or second plates that is split and isolated from each other and the split plates are connected respectively to the drains of said transistors.

44. The ferroelectric memory cell structure of claim 43, wherein said ferroelectric capacitors are formed overlying said transistors.

* * * * *

UNITED STATES PATENT AND TRADEMARK OFFICE
CERTIFICATE OF CORRECTION

PATENT NO. : 5,350,705

DATED : September 27, 1994

INVENTOR(S) : Michael P. Brassington, et al.

It is certified that error appears in the above-identified patent and that said Letters Patent is hereby corrected as shown below:

Col. 12, line 61, delete "Layer", insert --layer--.

Col. 13, line 54, after "connecting", insert --said refractory--.

Col. 13, line 55, delete "is" (first occurrence), insert --, wherein--.

Col. 14, line 24, delete "One", insert --one--.

Signed and Sealed this

Fourth Day of July, 1995

Attest:

BRUCE LEHMAN

Attesting Officer

Commissioner of Patents and Trademarks